(12) United States Patent
Imazaki et al.

(10) Patent No.: US 10,980,114 B2
(45) Date of Patent: Apr. 13, 2021

(54) PRINTED CIRCUIT BOARD AND METHOD OF MANUFACTURING A PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Eiko Imazaki, Osaka (JP); Koji Nitta, Osaka (JP); Kousuke Miura, Osaka (JP); Shoichiro Sakai, Osaka (JP); Kenji Takahashi, Osaka (JP); Masahiro Matsumoto, Osaka (JP); Hirohisa Saito, Osaka (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/640,435

(22) PCT Filed: Jul. 24, 2018

(86) PCT No.: PCT/JP2018/027615
§ 371 (c)(1),
(2) Date: Feb. 20, 2020

(87) PCT Pub. No.: WO2019/058745
PCT Pub. Date: Mar. 28, 2019

(65) Prior Publication Data
US 2020/0196445 A1 Jun. 18, 2020

(30) Foreign Application Priority Data

Sep. 22, 2017 (JP) .............................. JP2017-182781

(51) Int. Cl.
*H05K 1/11* (2006.01)
*H05K 3/42* (2006.01)

(52) U.S. Cl.
CPC ............. *H05K 1/115* (2013.01); *H05K 1/112* (2013.01); *H05K 3/422* (2013.01); *H05K 3/423* (2013.01);
(Continued)

(58) Field of Classification Search
CPC ........ H05K 1/115; H05K 3/422; H05K 3/423; H05K 2201/09563; H05K 2201/0959;
(Continued)

(56) References Cited

U.S. PATENT DOCUMENTS 4,980,270 A * 12/1990 Inasaka ................ H05K 3/0023
430/312
10,448,518 B2 * 10/2019 Choi ...................... H05K 3/188
(Continued)

FOREIGN PATENT DOCUMENTS

JP 2000-124615 4/2000
JP 2009-200356 9/2000
(Continued)

*Primary Examiner* — Ishwarbhai B Patel
(74) *Attorney, Agent, or Firm* — IPUSA, PLLC

(57) ABSTRACT

A printed circuit board according to one embodiment of the present invention is a printed circuit board including a plate-shaped or a sheet-shaped insulating material having a penetrating hole, and a metal plating layer layered on both surfaces of the insulating material and an inner peripheral surface of the insulating material, wherein an inner diameter of the penetrating hole monotonically decreases from a top surface of the insulating material toward a back surface, and wherein the inner diameter of the penetrating hole at a center in a thickness direction of the insulating material is smaller than an average of an opening diameter on the top side and an opening diameter on the back side.

5 Claims, 2 Drawing Sheets

(52) U.S. Cl.
CPC ............... *H05K 2201/0959* (2013.01); *H05K 2201/09563* (2013.01)

(58) Field of Classification Search
CPC .. H05K 3/00; H05K 3/18; H05K 3/40; H05K 3/42
See application file for complete search history.

(56) References Cited

U.S. PATENT DOCUMENTS

| | | | |
|---|---|---|---|
| 10,485,105 B2 * | 11/2019 | Lee .................... | H05K 1/115 |
| 2006/0021794 A1 * | 2/2006 | Cheng .................. | H05K 3/0032 |
| | | | 174/264 |
| 2009/0211799 A1 * | 8/2009 | Nagase .................. | H05K 3/381 |
| | | | 174/262 |

FOREIGN PATENT DOCUMENTS

| | | |
|---|---|---|
| JP | 2002-043752 | 2/2002 |
| JP | 02003347700 A * | 12/2003 |
| JP | 2004-311919 | 11/2004 |

* cited by examiner

PRINTED CIRCUIT BOARD AND METHOD OF MANUFACTURING A PRINTED CIRCUIT BOARD

TECHNICAL FIELD

The present disclosure relates to a printed circuit board and method of manufacturing a printed circuit board. The present application is based on and claims priority to Japanese Patent Application No. 2017-182781, filed on Sep. 22, 2017, the entire contents of which are herein incorporated by reference.

BACKGROUND ART

In recent years, interconnections of printed circuit boards have been shrinking, and there are demands for thinner printed circuit boards and smaller through-holes in printed circuit boards.

Generally, a through-hole is formed by performing electroless plating on the inner peripheral surface of a penetrating hole formed in an insulating material to become a substrate and performing electroplating on a metal layer layered by the electroless plating as an object to be adhered thereon. In the electroplating, plating currents are likely to concentrate on corner between top and back surfaces and the inner peripheral surface of the penetrating hole, and the plating thickness of the corner is likely to be greater than the other portions. Therefore, if the through-hole is decreased in diameter, the opening of the penetrating hole is closed by the metal plating layer prior to sufficiently filling the inside of the penetrating hole with the metal, which causes a disadvantage of generating a void (a space that is not filled with metal) in the inside of the penetrating hole.

In view of the disadvantage, a technique has been proposed in which a penetrating hole is formed into a drum shape (a shape in which two conical surfaces are combined so that the diameter becomes smaller in the center) that expands the diameters from the center in the thickness direction of the insulating material toward the top and back surfaces, so that the penetrating hole is filled with a plating metal such that the penetrating hole is sequentially closed from the center in the thickness direction, thereby preventing a void from being formed in the penetrating hole (see Japanese Laid-Open Patent Application Publication No. 2004-311919).

PRIOR ART DOCUMENTS

Patent Documents

Patent Document 1: Japanese Laid-Open Patent Application Publication No. 2004-311919

SUMMARY OF THE INVENTION

A printed wiring board according to one embodiment of the present disclosure is a printed circuit board including a plate-shaped or a sheet-shaped insulating material having a penetrating hole, and a metal plating layer layered on both surfaces of the insulating material and an inner peripheral surface of the penetrating hole, wherein an inner diameter of the penetrating hole monotonically decreases from a top surface to a back surface of the insulating material, and wherein the inner diameter of the penetrating hole at a center in a thickness direction of the insulating material is smaller than an average of an opening diameter on the top side and an opening diameter on the back side.

A method of manufacturing a printed circuit board according to another aspect of the present disclosure includes a step of forming a penetrating hole in a plate-shaped or a sheet-shaped insulating material, a step of cutting out an end of the penetrating hole on a top side throughout an entire circumference so as to expand an opening diameter of the penetrating hole on the top side, and a step of layering a metal on both surfaces of the insulating material and an inner peripheral surface of the penetrating hole.

MODE OF CARRYING OUT THE INVENTION

Figure 1:
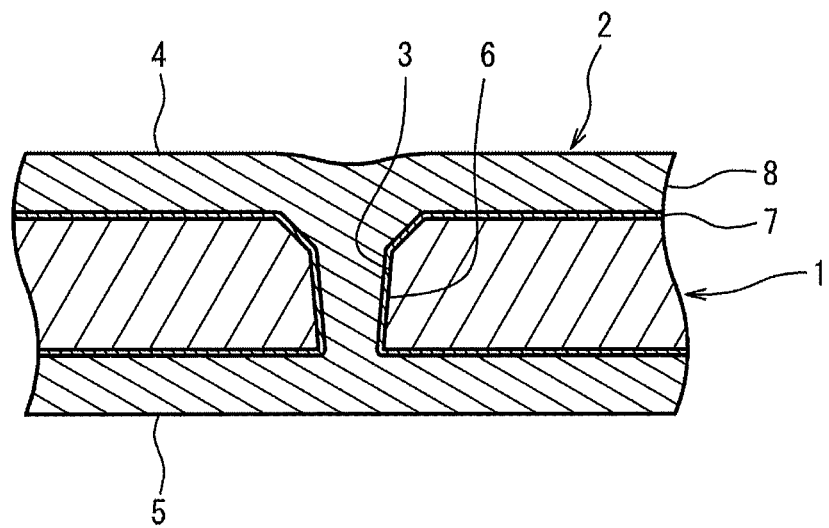
FIG. 1 is a schematic cross-sectional view illustrating a printed circuit board of one embodiment of the present disclosure.

Problems to be Solved by the Disclosure

When the method described in the aforementioned publication is used to prevent a void, a taper angle of the penetrating hole needs to be increased to some extent when considering a concentration of a plating current on the corner of the inner peripheral surface of the penetrating hole and the surface of the insulating material. For this reason, in the method described in the aforementioned publication, a recess is formed in a surface of a conductive pattern, specifically in an edge on the top side of the through-hole formed by filling the penetrating hole with a plating metal.

Thus, if the recess is formed in the surface of the through-hole portion of the conductive pattern, air may remain in the recess while, for example, layering a cover-lay, an additional insulating material and the like to form a multi-layer circuit board, and air may expand due to heating for adhesion, thereby preventing the adhesion.

The present disclosure has been made in accordance with the above-described circumstances, and is intended to provide a printed circuit board and a method of manufacturing a printed circuit board including a through-hole without a void and whose surface irregularities are small.

Effect of the Disclosure

A printed circuit board according to one embodiment of the present disclosure and a printed circuit board manufactured by a method of manufacturing a printed circuit board according to another embodiment of the present disclosure include a through-hole without a void and whose surface irregularities are small.

DESCRIPTION OF EMBODIMENTS OF THE PRESENT DISCLOSURE

A printed circuit board according to one embodiment of the present disclosure is a printed circuit board including a plate-shaped or a sheet-shaped insulating material having a penetrating hole, and a metal plating layer layered on both surfaces of the insulating material and an inner peripheral surface of the penetrating hole, wherein an inner diameter of the penetrating hole monotonically decreases from a top surface to a back surface of the insulating material, and wherein the inner diameter of the penetrating hole at a center in a thickness direction of the insulating material is smaller than an average of an opening diameter on the top side and an opening diameter on the back side.

In the printed circuit board, by monotonically decreasing the inner diameter of the through-hole from the top side to the back side of the insulating material, the end of the back side of the penetrating hole is first blocked during electroplating, and the penetrating hole is filled with a plating metal sequentially from the back side. In addition, because the inner diameter of the penetrating hole in the insulating material at the center of the thickness direction is smaller than the average of the opening diameter on the top side and the opening diameter on the back side, the diameter of the penetrating hole is partially increased at the end of the top side of the printed circuit board. Therefore, even when the plating current is concentrated on the corner between the inner peripheral surface of the penetrating hole and the top surface of the insulating material, and even when the plating thickness is locally increased, the end of the top side of the penetrating hole is not blocked first and a void is not generated. For this reason, by making the reduction rate of the inner diameter of the penetrating hole on the back side relatively small to efficiently fill the through-hole with the plating metal, the recess formed on the top side can be made small.

As used herein, "monotonic decrease" means a decrease without an increase.

In the printed circuit board, the penetrating hole includes a specific region, and the specific region has a top side end and a back side end. The top side end is a position where the distance in the thickness direction from the top surface of the insulation material is not less than 0.1 times and not more than 0.5 times the average thickness of the insulation material. The back side end is a position of the back side opening, and the reduction rate of the inner diameter of the specific region is preferably constant. As described above, by making the reduction rate of the inner diameter of the penetrating hole constant in the specific region, and setting the distance in the thickness direction from the top surface of the insulating material to the top side end within the range, the opening diameter of the penetrating hole on the top side can be made relatively small to be readily filled with the metal, while preventing the generation of a void that is caused by closing the opening of the penetrating hole during the plating in advance. As a result, the recess formed on the top side of the penetrating hole formed by filling the penetrating hole with a plating metal can be made smaller.

In the printed circuit board, the average inclination angle formed by the inner wall of the penetrating hole from the top side end of the specified region to the top surface of the insulating material and the central axis of the penetrating hole in the thickness direction is preferably 40 degrees or more and 70 degrees or less. As described above, by setting the average inclination angle within the above-described range, the volume of the penetrating hole on the top side can be made relatively small, and the formed recess can be made small, while reliably preventing the generation of a void caused by the rapid closure of the top side of the penetrating hole due to the concentration of the plating current.

In the printed circuit board, the opening diameter on the top side of the penetrating hole is preferably not less than 2.0 times and not more than 3.0 times the average thickness of the metal plating layer layered on both surfaces of the insulating material, and the opening diameter on the back side of the penetrating hole is preferably not less than 0.20 times and not more than 0.40 times the opening diameter on the top side. As described above, by setting the opening diameter on the top side and the opening diameter on the back side of the penetrating hole within the above-described range, when the thickness of the metal plating layer layered on both surfaces of the insulating material is optimized, the void of the through-hole can be prevented and the recess formed on the top side can be reduced.

In the printed circuit board, the average thickness of the insulating material is preferably 10 μm or more and 50 μm or less, and the average thickness of the metal plating layer layered on both surfaces of the insulating material is preferably 3 μm or more and 50 μm or less. Thus, by setting the average thickness of the insulating material and the average thickness of the metal plating layer within the above-described range, the interconnection density of the conductive pattern formed by the metal plating layer can be increased, and sufficient flexibility can be provided for the printed circuit board.

A method of manufacturing a printed circuit board according to another aspect of the present disclosure includes a process of forming a penetrating hole with a laser in a plate-shaped or sheet-shaped insulator, a process of cutting an end of the penetrating hole on a top side with a laser over the entire circumference so as to increase an opening diameter on the top side of the penetrating hole, and a process of layering a metal by plating on both surfaces of the penetrating hole and on the inner peripheral surface of the penetrating hole. The inner diameter of the penetrating hole is monotonically decreased from the top surface of the insulating material toward the back surface, and the inner diameter of the penetrating hole at the center in the thickness direction is smaller than the average of the opening diameter on the top side and the opening diameter on the back side of the penetrating hole.

In the method of manufacturing the printed circuit board, the inner diameter of the penetrating hole is monotonically reduced from the top surface of the insulating material toward the back surface, and in the process of layering the metal, the end on the back side of the penetrating hole is first blocked, and the penetrating hole is sequentially filled with a plating metal from the back side. In addition, because the reduction rate of the inner diameter of the penetrating hole on the top side is larger than the reduction rate on the back side, the diameter of the penetrating hole is partially larger at the end of the top side. Therefore, in the process of layering the metal, even when the plating current is concentrated on the corner between the inner peripheral surface of the penetrating hole and the top surfaces of the insulating material, and even when the plating thickness becomes locally greater, the penetrating hole is not blocked first and a void is not generated. Thus, the method of manufacturing the printed circuit board can manufacture the printed circuit board having the through-hole without the void and whose surface irregularities are small.

Here, the term "diameter" means a diameter equivalent to a circle (the diameter of an exact circle having the same area). Also, for convenience, the "top surface" refers to a surface having a larger inner diameter of the penetrating hole of both surfaces of the insulating material, and the "back surface" refers to the surface opposite to the top surface, and is not intended to limit the direction of the printed circuit board when manufacturing or using the printed circuit board. Moreover, the "average inclination angle" of the inner wall of the penetrating hole is calculated by dividing the inner peripheral surface of the though-hole into five or more in the thickness direction of the insulating material in the cross section including the center and calculating an average value of angles of straight lines connecting both ends of each region divided into five or more with respect to the central axis.

DETAILS OF EMBODIMENTS OF THE PRESENT DISCLOSURE

Hereinafter, embodiments of printed circuit boards in accordance with the present disclosure will be described in detail with reference to the drawings.

FIG. 1 illustrates a printed circuit board according to one embodiment of the present disclosure. The printed circuit board includes an insulating material 1 and a metal plating layer 2 layered on both surfaces of the insulating material 1.

The insulating material 1 includes a penetrating hole 3 that penetrates in the thickness direction. The metal plating layer 2 is also layered on the inner peripheral surface of the penetrating hole 3. That is, the metal plating layer 2 is formed by integrally forming a first metal layer 4 on a top side of the insulating material 1, the second metal layer 5 on a back side, and a through-hole 6 connecting the first metal layer 4 and the second metal layer 5 together.

<Insulating Material>

The insulating material 1 is a plate-shaped or sheet-shaped substrate that has insulating properties and supports the metal plating layer 2, and is preferably flexible.

The insulating material 1 can be famed of a resin composition mainly composed of synthetic resin. Examples of the synthetic resin that is the main component of the insulating material 1 include a polyamide, a polyimide, a polyamide-imide, a polyester, a liquid crystal polymer, and a fluorine resin. Among these, the polyamide, the polyimide and the polyamide-imide are preferably used in terms of mechanical strength such as heat resistance. The term "principal component" means a component having the highest mass content and preferably contains not less than 50 mass %, and more preferably not less than 80 mass %.

A lower limit of the average thickness of the insulating material 1 is preferably 10 µm, and more preferably 20 µm.

Meanwhile, the upper limit of the average thickness of the insulating material 1 is preferably 500 µm, more preferably 150 µm, and even more preferably 50 µm. If the average thickness of the insulating material 1 is less than the lower limit, the strength of the insulating material 1 may be insufficient. On the other hand, when the average thickness of the insulating material 1 exceeds the upper limit, the flexibility of the printed circuit board may be insufficient.

(Penetrating Hole)

Figure 2:
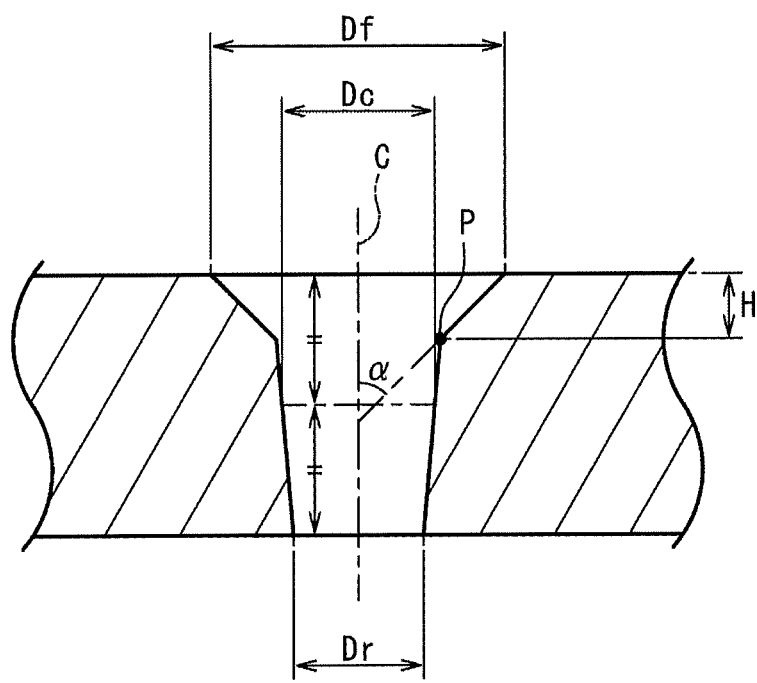
FIG. 2 is a schematic cross-sectional view illustrating a shape of a penetrating hole of an insulating material of the printed circuit board of FIG. 1 in detail.

In the penetrating hole 3, as illustrated in FIG. 2 in detail, the inner diameter of the printed circuit board monotonically decreases from the top surface of the insulating material 1 toward the back surface, and an inner diameter Dc of the insulating material 1 at the center in the thickness direction is smaller than the average of an opening diameter Df on the top side and an opening diameter Dr on the back side. That is, the penetrating hole 3 has a greater reduction rate on the top side of the inner diameter than the reduction rate on the back side. In other words, the inclination angle of the inner wall with respect to the central axis C of the penetrating hole 3 is greater on the top side.

Because the inner diameter of the penetrating hole 3 is monotonically reduced from the top surface of the insulating material 1 to the back surface, when forming the metal plating layer 2 by electroplating, the opening on the back side of the penetrating hole 3 is first closed by the metal plating layer 2, and then filled with the plating metal so that the closed region of the penetrating hole 3 sequentially increases from the back side to the top side. Thus, it is difficult to form a void in the through-hole 6 of the printed circuit board.

Further, because the inner diameter Dc at the center in the thickness direction of the insulating material 1 is smaller than the average $((Df+Dr)/2)$ of the opening diameter Df on the top side and the opening diameter Dr on the back side, the end of the through hole 3 on the top side has a relatively large diameter. Therefore, when the metal plating layer 2 is formed by electroplating, even when the plating current is concentrated on the corner (the end edge of the top side of the penetrating hole 3) between the inner peripheral surface of the penetrating hole 3 and the top surface of the insulating material 1, and even when the metal plating layer 2 is locally layered thick, the end of the penetrating hole 3 on the top side is not closed before the metal plating layer 2 ends filling the inside of the penetrating hole 3 with the plating metal. Further, because the end on the top side of the penetrating hole 3 partially increases its diameter, the diameter of the other portions becomes relatively small, and the penetrating hole 3 can be filled with the plating metal even if the thickness of the metal plating layer is reduced. As a result, the recess on the top side of the formed through-hole 6 is relatively small. Accordingly, the printed circuit board has a through-hole 6 without a void and whose surface irregularities are small.

The through-hole 3 preferably has a constant reduction rate of the inner diameter within a certain range continuously from the back surface of the insulating material 1 (the back side of the edge of the inner peripheral surface in the longitudinal cross section including the central axis C of the penetrating hole 3 is a straight line). As described above, by keeping the reduction rate of the inner diameter of the penetrating hole 3 constant on the back side, the inner peripheral surface of this portion of the penetrating hole 3 becomes a conical surface, thereby relatively easily forming the penetrating hole 3. Similarly, the reduction rate of the inner diameter of the penetrating hole 3 on the top side may be constant.

As a lower limit of the distance H in the thickness direction from the end P on the top side to the top surface of the insulating material 1 is preferably 0.1 times the average thickness of the insulating material 1 (the penetrating hole 3 is excluded and calculated), and more preferably 0.2 times the average thickness of the insulating material 1. On the other hand, the upper limit of the distance H in the thickness direction from the end P to the top surface of the insulating material 1 is preferably 0.5 times the average thickness of the insulating material 1, and more preferably 0.4 times the average thickness of the insulating material 1. When the distance H is less than the lower limit mentioned above, there is a concern that the generation of the void cannot be prevented due to the concentration of the plating current at the corner between the inner peripheral surface of the penetrating hole 3 and the surface of the insulating material 1. In addition, when the distance H exceeds the upper limit, the inside on the top side of the penetrating hole 3 cannot be sufficiently filled with the plating metal, and the recess on the top side of the through-hole 6 is liable to become large.

A lower limit of the average inclination angle α with respect to the central axis C is preferably 40 degrees, and more preferably 45 degrees. On the other hand, the upper limit of the average inclination angle α with respect to the central axis C is preferably 70 degrees and more preferably 65 degrees. When the average inclination angle α is less than the lower limit described above, there is a concern that the top side may be closed by the plating metal before finishing filling the inside of the penetrating hole 3 with the plating metal due to the concentration of the plating current at the corner between the inner peripheral surface of the penetrating hole 3 and the top surface of the insulating material 1, which may generate a void. On the other hand, when the average inclination angle α exceeds the upper limit, because the inner space on the top side of the penetrating hole 3 becomes large, the inner space cannot be sufficiently filled with the metal plating, and the recess on the top side of the through-hole 6 is liable to become large.

The lower limit of the opening diameter Df on the top side of the penetrating hole 3 is preferably 2.0 times the average thickness in the region (the first metal layer 4 and the second metal layer 5) to be layered on both surfaces of the insulating material 1 of the metal plating layer 2, and more preferably 2.2 times. Meanwhile, the upper limit of the opening diameter Df on the top side of the penetrating hole 3 is preferably 3.0 times the average thickness in the region to be layered on both surfaces of the insulating material 1 of the metal plating layer 2, and more preferably 2.8 times. When the opening diameter Df on the top side of the penetrating hole 3 is less than the lower limit, because the cross-sectional area on the back side of the penetrating hole 3 becomes too small, the connection between the first metal layer 4 and the second metal layer 5 may become uncertain. On the other hand, when the opening diameter Df on the top side of the penetrating hole 3 exceeds the upper limit, the recess on the top side of the through-hole 6 is liable to become large.

A lower limit of the opening diameter Dr on the back side of the penetrating hole 3 is preferably 0.20 times the opening diameter Df on the top side, and more preferably 0.22 times. On the other hand, the upper limit of the opening diameter Dr on the back side of the penetrating hole 3 is preferably 0.40 times the opening diameter Df on the surface side, and more preferably 0.38 times. When the opening diameter Dr on the back side of the penetrating hole 3 is less than the lower limit, because the cross-sectional area on the back side of the through-hole 6 is reduced, the connection between the first metal layer 4 and the second metal layer 5 is liable to become uncertain. On the other hand, when the opening diameter Dr on the back side of the penetrating hole 3 exceeds the upper limit, because the diameter on the top side of the penetrating hole 3 is not sufficiently expanded, the void is liable to be formed in the through-hole 6.

A method for forming a penetrating hole 3 may include, for example, laser machining, drilling and the like. Among them, the laser machining, which can form a fine penetrating hole 3 with high accuracy, is preferably used.

<Metal Plating Layer>

The metal plating layer 2 may include a conductive electroless plating layer 7 that is layered on the top surface, the back surface, and the inner peripheral surface of the penetrating hole 3 of the insulating material 1, and an electroplating layer 8 that is layered on the electroless plating layer 7.

A lower limit of the average thickness of the metal plating layer 2 to be layered on both surfaces of the insulating material 1 is preferably 3 µm, and more preferable 5 µm. Meanwhile, an upper limit of the average thickness of the metal plating layer 2 layered on both surfaces of the insulating material 1 is preferably 50 µm, and more preferably 20 µm. If the average thickness of the metal plating layer 2 is less than the lower limit, the strength of the metal plating layer 2 is liable to be insufficient. On the other hand, when the average thickness of the metal plating layer 2 exceeds the upper limit, there is a concern that the flexibility of the printed circuit board may be insufficient or that the interconnection formed by the metal plating layer 2 cannot be sufficiently miniaturized.

(Electroless Plating Layer)

The electroless plating layer 7 is a metallic thin layer formed by electroless plating and is used as an object to be adhered (cathode) for forming the electroplating layer 8 by electroplating.

Examples of the material of the electroless plating layer 7 include metals such as copper, silver, nickel, and palladium, among which copper is inexpensive, has excellent flexibility and low electrical resistance, and is particularly preferred.

Electroless plating, which forms the electroless plating layer 7, is a process in which a metal having catalytic activity is precipitated due to a reducing action of the catalyst, and can be performed by applying various commercially available electroless plating solutions.

The lower limit of the average thickness of the electroless plating layer 7 is preferably 0.05 µm and more preferably 0.10 µm. Meanwhile, the upper limit of the average thickness of the electroless plating layer 7 is preferably 0.7 µm, and more preferably 0.5 µm. When the average thickness of the electroless plating layer 7 is less than the lower limit, there is a concern that the plating metal may not sufficiently adhere to the electroless plating layer 7 during electroplating because the electrical resistance of the electroless plating layer 7 increases. On the other hand, when the average thickness of the electroless plating layer 7 exceeds the upper limit, the electroless plating layer 7 and the printed circuit board may become unnecessarily expensive.

(Electroplating Layer)

The electroplating layer 8 is foiled by layering a plating metal on the electroless plating layer 7 by electroplating using the electroless plating layer 7 as the cathode.

The plating metal that forms the electroplating layer 8 is copper, nickel, gold, or the like, among which copper is inexpensive, has low electrical resistance, and is preferably used.

The thickness of the electroplating layer 8 is selected such that the thickness of the metal plating layer 2 becomes a desired thickness, for example, by adjusting electroplating conditions such as the composition of the plating solution, the plating current, the plating period of time and the like.

As described above, because the diameter of the penetrating hole 3 is selected based on the average thickness of the metal plating layer 2, the inside of the penetrating hole 3 is filled with the electroplating layer 8 during electroplating to form a solid through-hole 6.

The electroplating to form the electroplating layer 8 may be performed by layering a resist pattern with an opening corresponding to the desired interconnection pattern on the outer surface of the electroless plating layer 7. This allows the electroplating layer 8 to be layered only to those portions exposed in the opening of the resist pattern of the electroless plating layer 7. Then, by removing the resist pattern after forming the electroplating layer 8, and removing the electroless plating layer 7 in the non-layered portion of the electroplating layer 8 by etching, the patterned metal plating layer 2 is formed into the desired interconnection pattern.

<Method of Manufacturing Printed Circuit Board>

As described above, the printed circuit board can be manufactured by a method including, for example, a process of forming a penetrating hole 3 with a laser for a material that forms an insulating material 1 (a penetrating hole forming process), a process of cutting an end of the penetrating hole 3 with a laser throughout the top side of the penetrating hole 3 in order to expand the opening diameter Df of the penetrating hole 3 (a penetrating hole cutting process), and a process of layering a metal by plating on both surfaces of the insulating material 1 and an inner peripheral surface of the penetrating hole 3 (a plating process).

In the penetrating hole forming process described above, a cylindrical shape or a conical shape penetrating hole 3 with a diameter from the top side to the back side is formed by irradiating the insulation material 1 with a laser.

In the penetrating hole cutting process, for example, by a method, for example, of emitting a laser having a larger light collection angle than that of the penetrating hole forming process coaxially with the penetrating hole 3, the corner of the inner surface of the penetrating hole 3 and the top surface of the insulating layer 1 is cut out to bevel the corner in the longitudinal cross-section including the central axis C of the penetrating hole 3. Thus, the penetrating hole 3 is transformed so that the inner diameter of the through hole 3 monotonically decreases from the top surface of the insulating material 1 toward the back surface, and that the inner diameter Dc at the center in the thickness direction of the insulating material 1 is smaller than the average of the opening diameter Df on the top side and the opening diameter Dr at the back side.

The above-described plating process preferably includes a process of layering the electroless plating layer 7 by electroless plating on both surfaces of the insulating material 1 and the inner peripheral surface of the penetrating hole 3, and a process of layering the electroplating layer 8 by electroplating using the electroless plating layer 7 as an object to be adhered. As described above, by forming the electroless plating layer 7 and then layering the electrolytic plating layer 8 on the electroless plating layer 7, a dense and uniform metal plating layer 2 can be formed readily and inexpensively.

Advantages

In such a printed circuit board, the inner diameter of the penetrating hole 3 is monotonically decreased from the top surface of the insulating material 1 to the back surface, so that the end of the penetrating hole 3 on the back side is first blocked during electroplating to form the metal plating layer 2, and the plating metal is sequentially deposited from the back side. Further, in the printed circuit board, because the inner diameter Dc at the center in the thickness direction of the insulating material 1 of the penetrating hole 3 is smaller than the average of the opening diameter Df on the top side and the opening diameter Dr on the back side, the diameter of the penetrating hole 3 is partially larger at the end on the top side. Thus, even when the plating current is concentrated on the corner of the inner peripheral surface of the penetrating hole 3 and the insulating material 1 and even when the plating thickness becomes partially great, the end on the top side of the penetrating hole 3 is not blocked at an early stage, and a void is not generated. Therefore, by making the reduction rate of the inner diameter of the penetrating hole 3 relatively small and making the opening diameter of the top side relatively small, the plating metal can be efficiently deposited, and the recess formed on the top side of the through hole 6 formed by filling the penetrating hole 3 with the plating metal can be made small. Accordingly, when additional layers, such as a cover, are layered on the surface of the metal plating layer 2, air is not left in the recess on the top side of the through-hole 6 and does not adversely affect the printed circuit board.

Other Embodiments

The embodiments disclosed herein should be considered to be illustrative in all respects and not restrictive. The scope of the invention is not limited to the construction of the above embodiments, but is set forth by the appended claims, and is intended to include all modifications within the meaning and scope of the claims and equivalents.

The printed circuit board may include a solder resist to coat a metal plating layer, an additional functional layer such as a cover layer, an additional insulating material and metal plating layer to provide a multi-layer circuit board, and the like.

Figure 3:
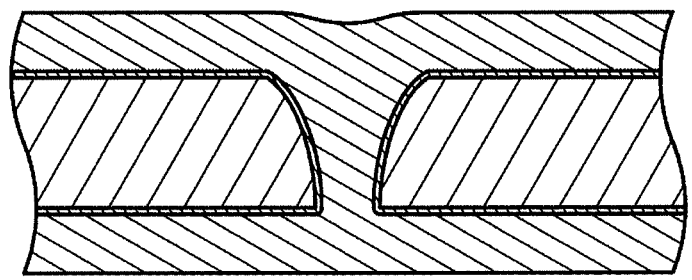
FIG. 3 is a schematic cross-sectional view illustrating a printed circuit board in an embodiment different from FIG. 1 of the present disclosure.

As illustrated in FIG. 1, the printed circuit board is not limited to the one in which the inclination angle with respect to the central axis of the inner surface of the penetrating hole varies discontinuously. As illustrated in FIG. 3, the inclination angle with respect to the central axis of the inner surface of the penetrating hole may gradually and continuously decrease from the top side to the back side.

Figure 4:
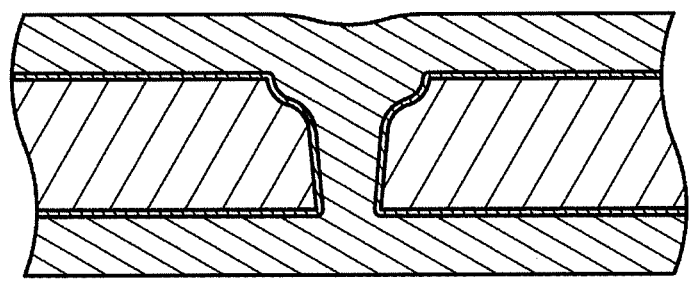
FIG. 4 is a schematic cross-sectional view illustrating a printed circuit board in a different embodiment from FIGS. 1 and 3 of the present disclosure.

In addition, in the printed circuit board, as illustrated in FIG. 4, the angle of inclination with respect to the central axis of the inner surface of the penetrating hole may be increased from the top side to the back side and then decreased. In FIG. 4, the inclination angle with respect to the central axis of the inner surface of the penetrating hole is continuously changed, but the inclination angle with respect to the central axis of the inner surface of the penetrating hole may be discontinuously changed so as to form one or more angles.

The printed circuit board may be patterned to form a desired conductive pattern by forming an electroless plating layer on the entire surface of the electroless plating layer, that is, by layering a plating metal layer on both surfaces of an insulating material, and then layering a resist pattern to selectively remove the plating metal layer by etching.

In the printed circuit board, the electroless plating layer may be omitted. For example, a thin underlying conductive layer may be formed on both surfaces of the insulating material and the inner peripheral surface of the penetrating hole by vapor-depositing, sputtering, applying and firing ink containing conductive particles, and the like, and a metal plating layer may be formed on the underlying conductive layer as an object to be adhered by electroplating.

The printed circuit board may be manufactured by forming the penetrating hole in the insulating material using means other than the laser.

DESCRIPTION OF THE REFERENCE NUMERALS

1 Insulating Material
2 Metal Plating Layer
3 Through Hole
4 First Metal Layer
5 Second Metal Layer
6 Through Hole
7 Electroless Plating Layer
8 Electroplating Layer

The invention claimed is:

1. A printed circuit board, comprising:
   a plate-shaped or a sheet-shaped insulating material having a penetrating hole; and
   a metal plating layer layered on both surfaces of the insulating material and an inner peripheral surface of the penetrating hole,
   wherein an inner diameter of the penetrating hole monotonically decreases from a top surface to a back surface of the insulating material,
   wherein the inner diameter of the penetrating hole at a center in a thickness direction of the insulating material is smaller than an average of an opening diameter on a top side and an opening diameter on a back side,
   wherein the penetrating hole includes a specific region,
   wherein the specific region includes a top side end and a back side end,
   wherein the top side end is located at a position where a distance from the top surface of the insulating material in a thickness direction is not less than 0.1 times and not more than 0.5 times an average thickness of the insulating material,
   wherein the back side end is located at an opening on the back side,
   wherein a reduction rate of a diameter from the top surface to the top side end is greater than a reduction rate of the specific region, and
   wherein the back side end is located farthest from the top surface in the penetrating hole, and has the smallest diameter in the penetrating hole.

2. The printed circuit board as claimed in claim 1,
   wherein a reduction rate of a diameter of the specific region is constant.

3. The printed circuit board as claimed in claim 2, wherein an average inclination angle formed by an inner wall of the penetrating hole from the top side end of the specific region to the top surface of the insulating material and a central axis of the penetrating hole in the thickness direction is 40 degrees or more and 70 degrees or less.

4. The printed circuit board as claimed in claim 1,
   wherein the opening diameter of the penetrating hole on the top side is not less than 2.0 and not more than 10 times the average thickness of the metal plating layer layered on the both surfaces of the insulating material, and
   wherein the opening diameter of the penetrating hole on the back side is not less than 0.20 and not more than 0.40 times the opening diameter on the top side.

5. The printed circuit board as claimed in claim 1,
   wherein the average thickness of the insulating material is not less than 10 μm and not more than 50 μm, and
   wherein the average thickness of the metal plating layer layered on the both surfaces is not less than 3 μm and not more than 50 μm.

* * * * *